United States Patent
Kawakami et al.

(10) Patent No.: US 8,404,169 B2
(45) Date of Patent: Mar. 26, 2013

(54) IMPRINT APPARATUS AND METHOD OF MANUFACTURING ARTICLE

(75) Inventors: Eigo Kawakami, Utsunomiya (JP); Hideki Ina, Tokyo (JP); Junichi Seki, Yokohama (JP); Atsunori Terasaki, Kawasaki (JP); Shingo Okushima, Kawasaki (JP); Motoki Okinaka, Inagi (JP)

(73) Assignee: Canon Kabushiki Kaisha, Tokyo (JP)

( * ) Notice: Subject to any disclaimer, the term of this patent is extended or adjusted under 35 U.S.C. 154(b) by 488 days.

(21) Appl. No.: 12/566,572

(22) Filed: Sep. 24, 2009

(65) Prior Publication Data

US 2010/0072664 A1    Mar. 25, 2010

(30) Foreign Application Priority Data

Sep. 25, 2008  (JP) ................................ 2008-246333

(51) Int. Cl.
  *B29B 11/08*   (2006.01)
  *B29C 45/76*   (2006.01)
(52) U.S. Cl. ........ 264/293; 264/40.1; 425/150; 977/887
(58) Field of Classification Search .................. 264/293, 264/40.1; 425/150; 977/887
See application file for complete search history.

(56) References Cited

U.S. PATENT DOCUMENTS

| 7,027,156 | B2 | 4/2006 | Watts et al. | |
|---|---|---|---|---|
| 7,170,603 | B2 | 1/2007 | Katayama | |
| 2004/0021866 | A1* | 2/2004 | Watts et al. | 356/401 |
| 2005/0212156 | A1* | 9/2005 | Tokita et al. | 264/1.36 |
| 2007/0102844 | A1* | 5/2007 | Simon et al. | 264/259 |
| 2007/0145639 | A1* | 6/2007 | Seki et al. | 264/293 |
| 2007/0237886 | A1* | 10/2007 | Dijksman et al. | 427/8 |

FOREIGN PATENT DOCUMENTS

| JP | 3548428 A | 1/2000 |
|---|---|---|
| JP | 2007-184342 A | 7/2007 |

* cited by examiner

*Primary Examiner* — Yogendra Gupta
*Assistant Examiner* — Jeremiah Smith
(74) *Attorney, Agent, or Firm* — Canon USA, Inc., IP Division

(57) ABSTRACT

An imprint apparatus for pressing resin and a mold to each other in a Z-axis direction to form a resin pattern on a shot region includes: a mold chuck; an X-Y stage; a reference mark formed on the stage; a first scope configured to measure a positional deviation in an x-y plane between a mold mark and the reference mark; a second scope configured to measure a position of a substrate mark in the plane not via the mold mark; and a dispenser configured to dispense resin. In the plane, the dispenser center is deviated in position from the mold chuck center by a first distance in a first direction, and the second scope center is deviated in position from the dispenser center by a distance smaller than twice the first distance in the first direction or a second direction opposite thereto.

6 Claims, 10 Drawing Sheets

IMPRINT APPARATUS AND METHOD OF MANUFACTURING ARTICLE

BACKGROUND OF THE INVENTION

1. Field of the Invention

The present invention relates to an imprint apparatus for pressing resin on a shot region of a substrate and a mold to each other to form a resin pattern on the shot region.

2. Description of the Related Art

There is known nanoimprinting, which is a technique replacing a method of forming fine patterns of semiconductor devices and micro electro-mechanical systems (MEMS) by photolithography using ultraviolet rays, X-rays, and electron beams. In the nanoimprinting, a mold (also referred to as a "template or original") having fine patterns formed by exposure with an electron beam is pressed against (imprinted onto) a substrate, such as a wafer, coated with a resin material to transfer the patterns to the resin.

There are several types of nanoimprinting, and one of those is a photo-curing method (U.S. Pat. No. 7,027,156). In the photo-curing method, a transparent mold is pressed against a UV-curable resin, and the mold is separated (released) after the resin is exposed and cured. The nanoimprinting using the photo-curing method is suitable for the manufacture of semiconductor integrated circuits because the temperature control is relatively easy and an alignment mark on the substrate can be observed through the transparent mold.

Although there is a method in which a pattern is transferred to the entire surface of the substrate at a time, taking into consideration the case where different patterns are superposed, it is desirable to employ a step-and-repeat method, in which a mold having substantially the same size as the chip of the device to be manufactured is fabricated and the pattern thereon is successively transferred to the shot regions on the substrate.

In addition, it is desirable to use a suitable one of a die-by-die method, in which the alignment is performed on each shot region, and a global alignment method, depending on the alignment accuracy of the shot regions and the throughput.

In conventional semiconductor exposure apparatuses, the time for measuring the sample shot regions during global alignment is a problem from the standpoint of throughput.

To overcome the above-described problem, Japanese Patent Laid-Open No. 2007-184342 discloses a method in which a stage for measurement is prepared separately from the substrate stage for exposure that carries the substrate, and in which a plurality of alignment measurement devices simultaneously measure the sample shot regions on the substrate in an off-axis manner. Although this method can reduce the time for measurement because the substrate stage does not move when the sample shot regions are measured, a stage for measurement needs to be prepared separately from the substrate stage for exposure and a substrate conveying unit has to be installed between the stages. If, instead, the substrate stage for exposure that carries the substrate is moved to a position of the alignment measurement devices to measure the sample shot regions, the footprint of the exposure apparatus increases, resulting in a problem in that the entire apparatus becomes large.

On the other hand, in nanoimprinting apparatuses, a dispenser head for discharging UV-curable resin is usually disposed near a mold holding unit from the standpoint of the required stroke length of the substrate stage. Therefore, if both die-by-die alignment and the global alignment are to be performed, it is difficult to secure a space for an off-axis alignment scope for measuring the sample shot regions used in the global alignment. Depending on the position of the off-axis alignment scope, the stroke length of the substrate stage added to measure the sample shot regions may become too large, or the throughput of the apparatus may be reduced.

SUMMARY OF THE INVENTION

The present invention provides an imprint apparatus for pressing resin on a shot region of a substrate and a mold to each other to form a resin pattern on the shot region. The apparatus includes a mold chuck; an X-Y stage including a substrate chuck, resin on the shot region of the substrate held by the substrate chuck and the mold held by the mold chuck being pressed to each other in a Z-axis direction; a reference mark formed on the X-Y stage; a first scope configured to measure a positional deviation in an x-y plane between a mold mark formed on the mold held by the mold chuck and the reference mark; a second scope configured to measure a position of a substrate mark formed on the substrate in the x-y plane not via the mold mark; and a dispenser configured to dispense resin on the shot region. In the x-y plane, a center of the dispenser is disposed at a position deviated from a center of the mold chuck by a first distance (>0) in a first direction, and a center of the second scope is disposed at a position deviated from the center of the dispenser by a distance smaller than twice the first distance in the first direction or a second direction opposite to the first direction.

The present invention is advantageous in a stroke of the X-Y stage in the x-y plane.

Other objects and advantages besides those discussed above shall be apparent to those skilled in the art from the description of a preferred embodiment of the invention which follows. In the description, reference is made to accompanying drawings, which form apart thereof, and which illustrate an example of the invention. Such example, however, is not exhaustive of the various embodiments of the invention, and therefore reference is made to the claims which follow the description for determining the scope of the invention.

Further features of the present invention will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

DESCRIPTION OF THE EMBODIMENTS

Referring to the attached drawings, a nanoimprint apparatus (imprint apparatus) using a photo-curing method according to embodiments of the present invention will be described.

First Embodiment

Figure 1:
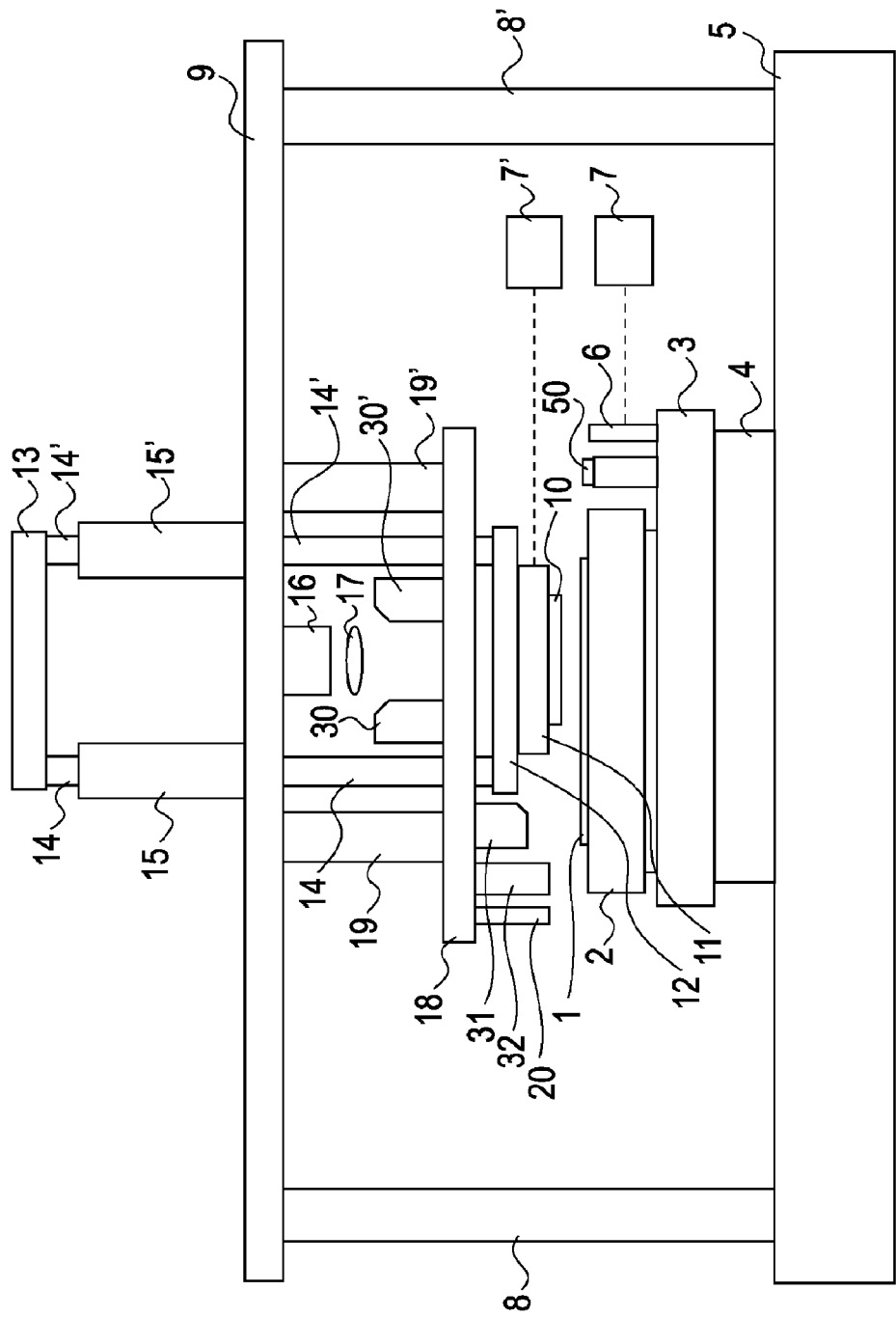
FIG. 1 shows a structure of a nanoimprint apparatus according to a first embodiment of the present invention.
Figure 2:
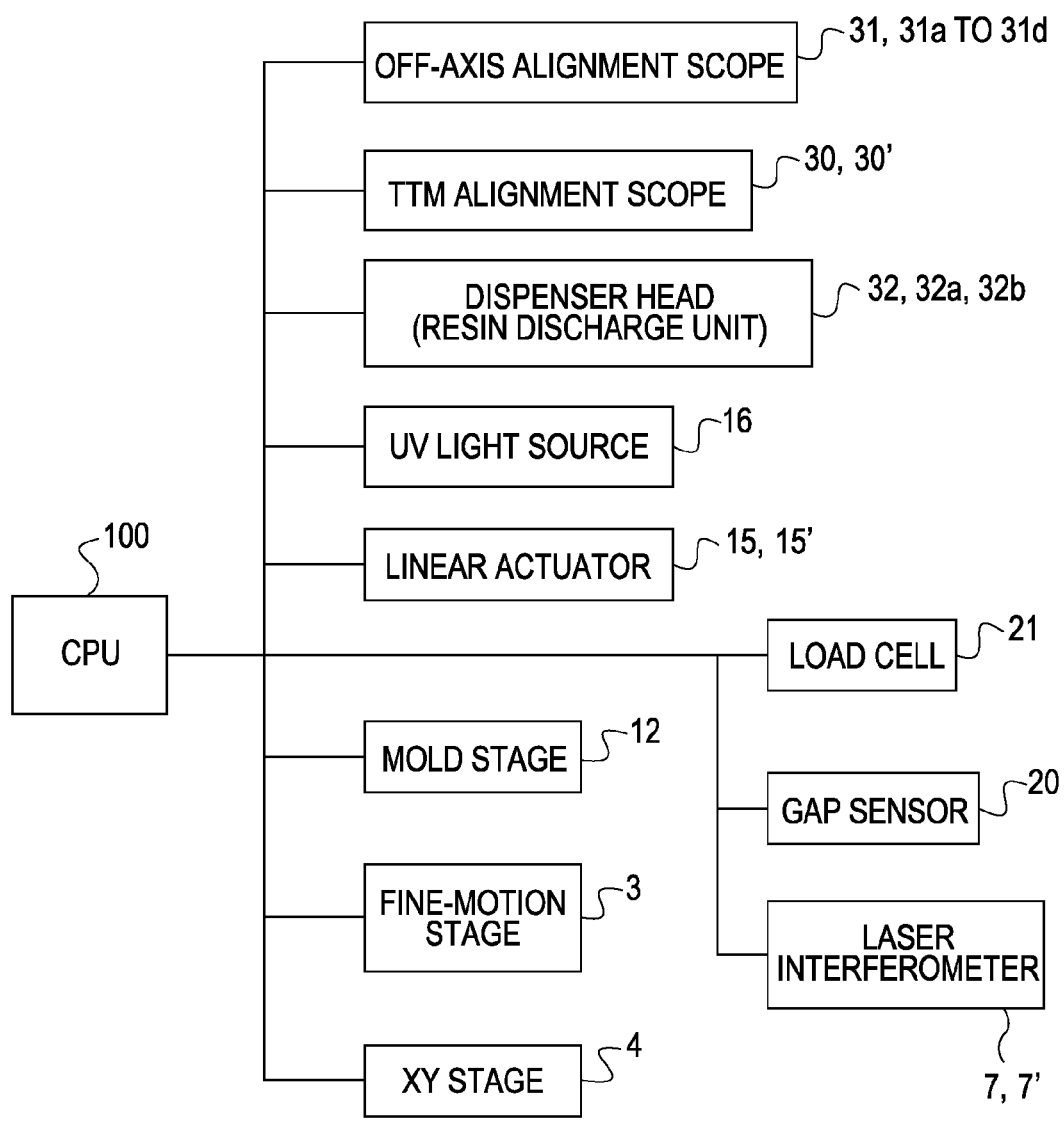
FIG. 2 is a control block diagram of the nanoimprint apparatus according to the first embodiment.
Figure 10:
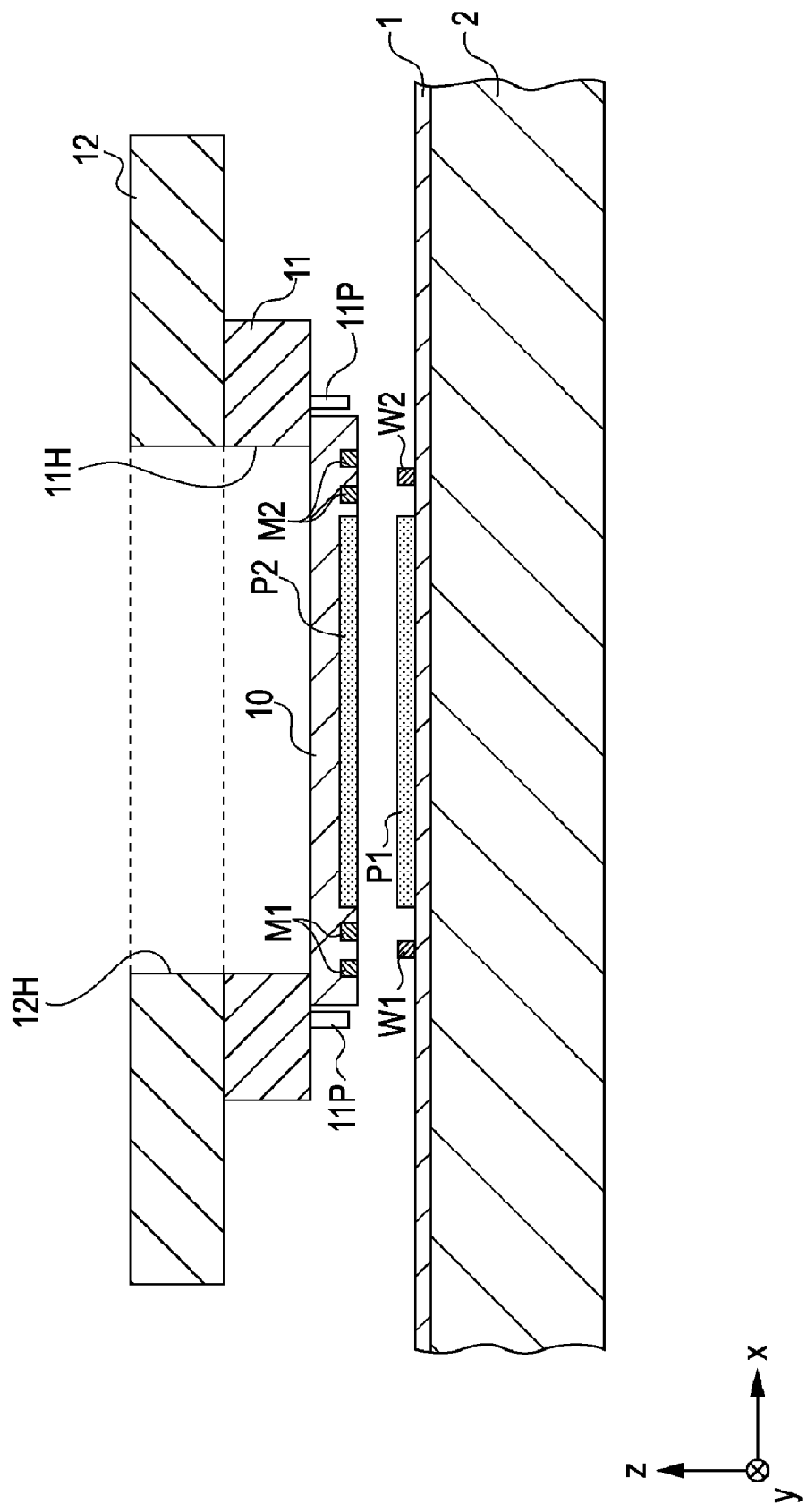
FIG. 10 is a cross-sectional view of the vicinity of a mold chuck, showing an arrangement of alignment marks.

FIG. 1 shows a structure of an imprint apparatus according to a first embodiment of the present invention. FIG. 2 is a control block diagram of the imprint apparatus according to the first embodiment. FIG. 10 is a cross-sectional view of the vicinity of a mold chuck, showing an arrangement of alignment marks according to the first embodiment.

FIGS. 1, 2, and 10 show a wafer 1, serving as a substrate, a wafer chuck 2 (also referred to as a "substrate chuck") for holding the wafer 1, and a fine-motion stage 3 having a function for correcting the position in the θ (rotation about the Z-axis) direction of the wafer 1, a function for adjusting the z position of the wafer 1, and a tilt function for correcting the inclination of the wafer 1. The fine-motion stage 3 is disposed on an X-Y stage 4 for bringing the wafer 1 to a predetermined position. In the following description, the fine-motion stage 3 and the X-Y stage 4 are collectively called, a substrate stage, a wafer stage, or an X-Y stage.

The X-Y stage 4 is placed on a base 5. A reference mirror 6 attached to the fine-motion stage 3 reflects light from a laser interferometer 7 to measure the position of the fine-motion stage 3 in the x and y directions (y direction is not shown). Posts 8 and 8' standing upright on the base 5 support a top board 9.

A mold 10 has, on the surface thereof, a protruding and recessed pattern P2 to be transferred to the wafer 1, and is fixed to a mold chuck 11 by a mechanical holding unit (not shown). Similarly, the mold chuck 11 is placed on a mold chuck stage 12 (also referred to as a "mold stage") by a mechanical holding unit (not shown). A plurality of positioning pins 11P restrict the position of the mold 10 on the mold chuck 11, when the mold 10 is installed on the mold chuck 11.

The mold chuck stage 12 has a function for correcting the position in the θ (rotation about the Z-axis) direction of the mold 10 (mold chuck 11) and a tilt function for correcting the inclination of the mold 10. The mold chuck stage 12 has a reflection surface for reflecting light from the laser interferometer 7' in order to measure the position in the x and y directions (y direction is not shown) thereof. The mold chuck 11 and the mold chuck stage 12 have openings 11H and 12H, respectively, that allow UV rays emitted from a UV light source 16 to pass through a collimating lens 17 to the mold 10.

Guide bars 14 and 14' penetrating the top board 9 are fixed to the mold chuck stage 12 at one end and to a guide bar plate 13 at the other end. Linear actuators 15 and 15' formed of air cylinders or linear motors drive the guide bars 14 and 14' in the Z-axis direction in FIG. 1 so as to press the mold 10, which is held by the mold chuck 11, against the wafer 1 or separate the mold 10 from the wafer 1.

An alignment scope shelf 18 is supported between posts 19 and 19' so as to be hung from the top board 9, and the guide bars 14 and 14' penetrate the alignment scope shelf 18. A gap sensor 20, which is a capacitance sensor or the like, measures the height (flatness) of the wafer 1 on the wafer chuck 2. A plurality of load cells 21 (not shown in FIG. 1) attached to the mold chuck 11 or the mold chuck stage 12 measure the pressing force of the mold 10.

Through-the-mold (TTM) alignment scopes 30 and 30' (also referred to as "first alignment scopes") are used in the alignment measurement. These scopes 30 and 30' include an optical system and an image-pickup system or a photodetector for measuring the positional deviation between an alignment mark formed on the wafer 1 (also referred to as a "substrate mark") and an alignment mark formed on the mold (also referred to as a "mold mark"). Using the TTM alignment scopes 30 and 30', the positional deviations in the x and y directions between the wafer 1 and the mold 10 are measured.

An off-axis alignment scope (also referred to as a "second scope") 31 for global alignment is disposed on the lower surface of the alignment scope shelf 18 and measures the position of an alignment mark (also referred to as a "substrate mark") on the wafer. The off-axis alignment scope 31 measures the position in the xy plane of the alignment mark formed on the wafer 1 held by the wafer chuck 2 without via the mold 10 (mold mark). The off-axis alignment scope 31 can change the position thereof in the xy plane so that it can cope with a change in position of the alignment mark on the wafer 1 according to a change in the shot size or layout of the shot regions.

A dispenser head (resin discharge unit) 32 has resin drop nozzles for dropping liquid resin on the surface of the wafer 1. The liquid resin is desirably a photo-curing resin.

A reference mark 50 is provided on a reference mark mount disposed on the fine-motion stage 3 (X-Y stage).

A central processing unit (CPU) 100 controls the foregoing actuators and sensors and makes the imprint apparatus perform a predetermined operation.

Figure 7:
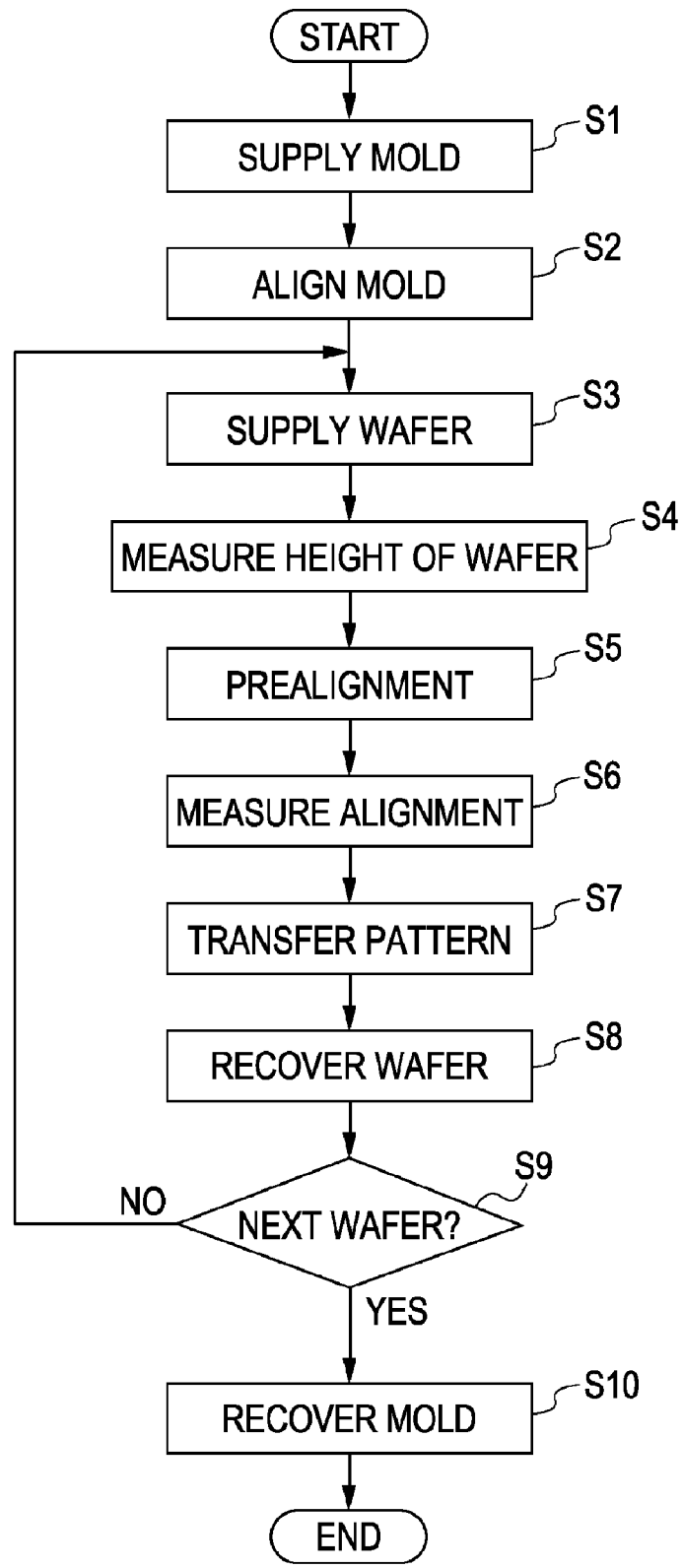
FIG. 7 is a flowchart of a process of successively transferring a pattern of a layer to a plurality of wafers.

Referring to FIGS. 1 and 7 to 10, operation of the nanoimprint apparatus during fabrication of semiconductor devices will be described. FIG. 7 is a flowchart of a process of transferring a pattern of a layer to a plurality of wafers using the same mold.

In FIG. 7, in step S1, the mold 10 is supplied to the mold chuck 11 by a mold conveying device (not shown).

In step S2, by simultaneously observing alignment marks M1 and M2 on the mold 10, which are shown in FIG. 10, and the reference mark 50 on the fine-motion stage 3 using the TTM alignment scopes 30 and 30', the positional deviation therebetween is measured.

Then, according to the result of measurement, the mold chuck stage 12 mainly corrects the position of the mold 10 in the θ (rotation about the Z-axis) direction.

Next, in step S3, the wafer 1 is supplied to the wafer chuck 2 by a wafer conveying device (not shown).

In step S4, the X-Y stage 4 is driven and the height (flatness) of the entire surface of the wafer 1 is measured with the gap sensor 20. As will be described below, this measurement data will be used when the shot surface of the wafer 1 is aligned with the reference plane of the apparatus (not shown) before imprinting.

In step S5, images of a plurality of pre-alignment marks (not shown) previously transferred to the wafer 1 are captured by a pre-alignment measurement device (not shown). Then, the deviation of the plurality of pre-alignment marks in the x and y directions with respect to the apparatus is measured through image processing, and the position of the wafer 1 in the θ (rotation about the Z-axis) direction is corrected according to the result.

Figure 9:
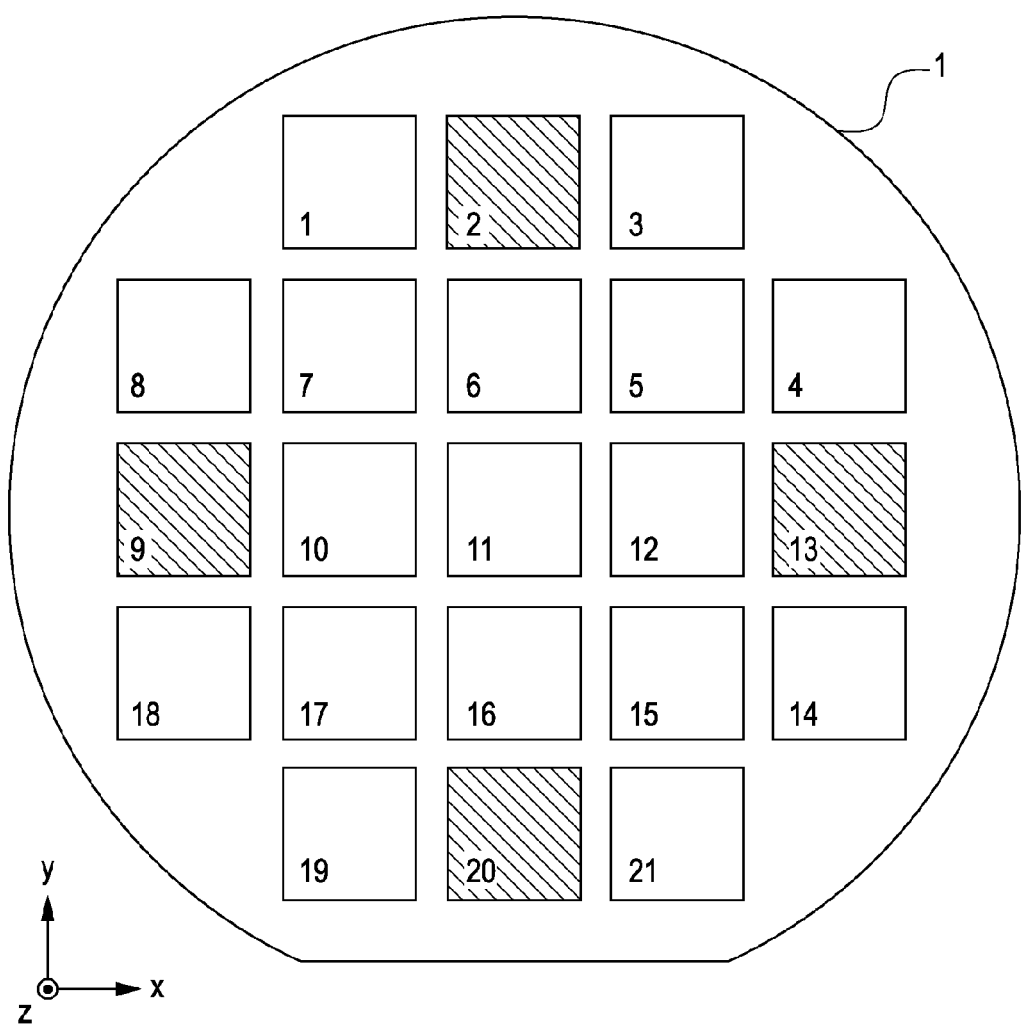
FIG. 9 shows an arrangement of sample shot regions for global alignment measurement.

In step S6, by driving the X-Y stage 4, hatched shot regions 2, 9, 13, and 20 (sample measurement shot regions or, simply, sample shot regions), shown in FIG. 9, are sequentially moved to a position beneath the off-axis alignment scope 31. Then, for each of the sample measurement shot regions, images of alignment marks W1 and W2 on the wafer 1, shown in FIG. 10, are captured with the off-axis alignment scope 31 to measure the positional deviations in the x and y directions (position in the xy plane) with respect to the apparatus reference (not shown).

In FIG. 10, reference numeral P1 denotes the pattern that is transferred from a preceding layer along with the alignment marks W1 and W2, and reference numeral P2 denotes the pattern on the mold 10.

From the measured positional deviations in the x and y directions, the positional deviation in the θ (rotation about the Z-axis) direction is calculated.

Then, from the result of measurement of the sample measurement shot regions in FIG. 9 with the off-axis alignment scope, the deviations in the x, y, and θ directions in the shot regions on the wafer 1 are calculated, and the target position of the wafer stage when the pattern is transferred to each shot region is determined. This determination is performed by calculating the coefficient of the expression approximating the coordinates of the measured shot regions through the coordinate transformation of the coordinates of the design shot regions, using the least-squares method or the like.

This is the same method as the global alignment measurement method used in a semiconductor projection exposure apparatus using a step-and-repeat method, which is disclosed in, for example, Japanese Patent No. 03548428.

Figure 8:
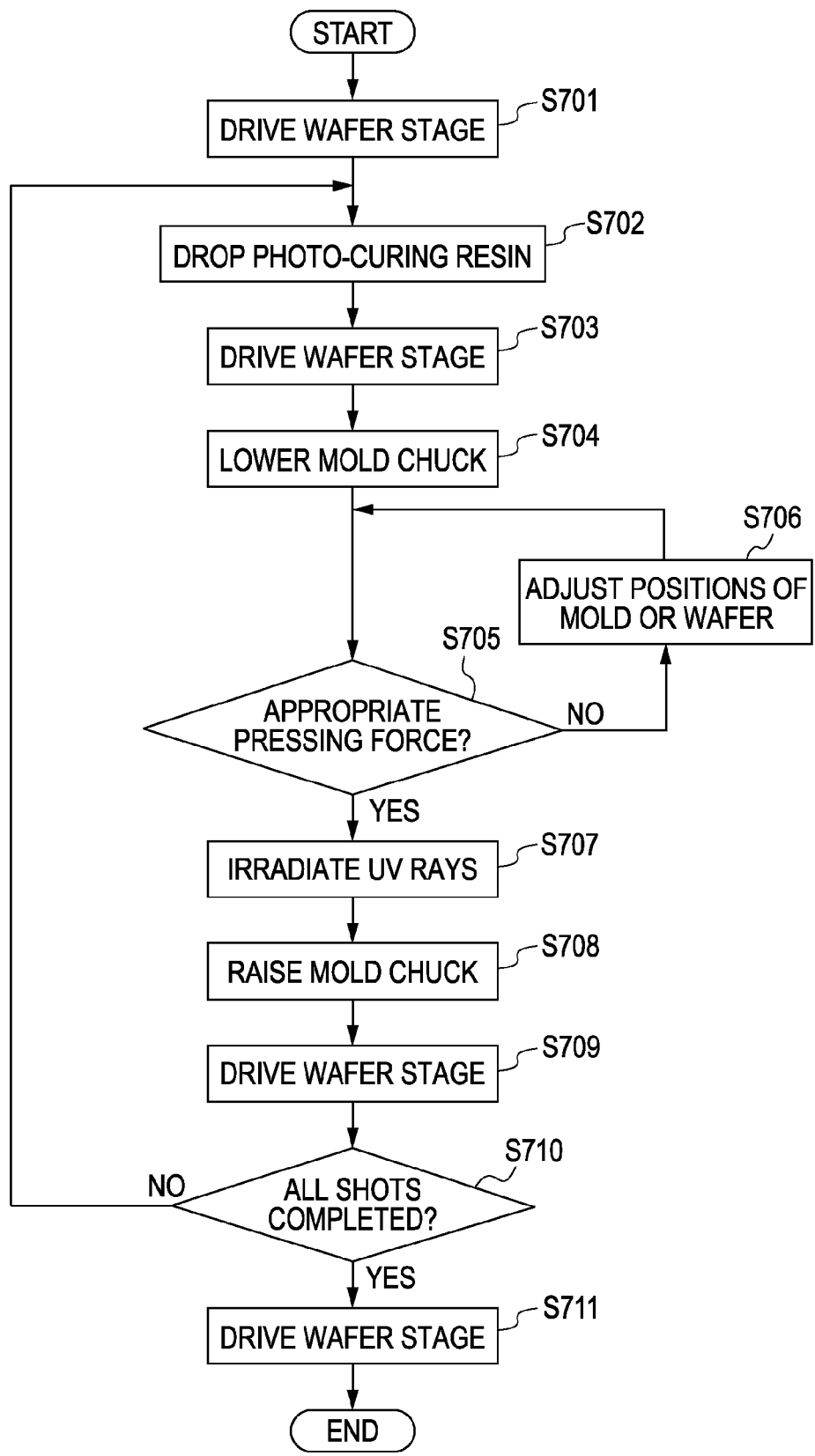
FIG. 8 is a detailed flowchart of a process of transferring a pattern to one wafer.

Next, in step S7, the pattern is transferred to each shot region on the wafer 1, as shown in the flowchart in FIG. 8.

When the pattern has been transferred to all the shot regions, in step S8, the wafer conveying device (not shown) recovers the wafer 1 from the wafer chuck 2.

In step S9, whether there is a subsequent wafer to be subjected to the pattern transfer is determined. If there is such a wafer, the process returns to step S3, and if there is no such wafer, the process proceeds to step S10.

In step S10, the mold conveying device (not shown) recovers the mold 10 from the mold chuck 11, thus completing the pattern transfer to the plurality of wafers.

FIG. 8 is a flowchart of a process of transferring a pattern to one wafer with the nanoimprint apparatus according to the first embodiment of the present invention, corresponding to step S7 in FIG. 7.

Referring to FIGS. 8, 1, and 2, the operation and advantages of the nanoimprint apparatus according to the first embodiment of the present invention will be described.

In FIG. 8, first, in step S701, the X-Y stage 4 is driven to move the wafer chuck 2 carrying the wafer 1 and bring the area in the wafer 1 to which a pattern is to be transferred (shot region) to a position beneath the dispenser head 32.

In step S702, a photo-curing resin is dropped onto the target shot region on the wafer 1 with the dispenser head 32.

Then, in step S703, the X-Y stage 4 is driven so as to bring the surface of the shot region to a position facing the pattern P2 on the mold 10. At this time, the position of the wafer stage is determined according to the result of the alignment measurement in step S6 in FIG. 7, and the wafer stage is moved to the target position.

Furthermore, the inclination and the height in the z direction of the wafer chuck 2 are adjusted by the fine-motion stage 3 in accordance with the measurement data of the height of the wafer, and the surface of the shot region of the wafer 1 is aligned with the reference plane (not shown) of the apparatus.

In step S704, the linear actuators 15 and 15' are driven to lower the mold chuck 11 to a predetermined position.

In step S705, whether the pressing force of the mold 10 is appropriate is determined from the output of the plurality of load cells 21 (not shown) attached to the mold chuck 11 or the mold chuck stage 12. If the pressing force is not within a predetermined range (step S705—NO), the process proceeds to S706.

In step S706, the pressing force of the mold 10 is adjusted either by changing the position of the mold chuck 11 in the z direction by the linear actuators 15 and 15' or by changing the position of the wafer chuck 2 in the z direction by the fine-motion stage 3. Steps S705 and S706 are repeated until the intended pressing force is achieved. When the pressing force of the mold 10 is determined to be appropriate in step S705 (step S705—YES), the process proceeds to S707.

In step S707, the UV light source 16 irradiates UV rays for a predetermined period of time.

When the irradiation of the UV rays is completed, in step S708, the linear actuators 15 and 15' are driven to raise the mold chuck 11, and the mold 10 is separated from the cured resin on the wafer 1.

In step S709, the X-Y stage 4 is driven to move the wafer 1 and bring the next shot region beneath the dispenser head 32.

In step S710, whether the pattern has been transferred to all the shot regions on the wafer 1 is determined.

If there are shot regions to which the pattern has not been transferred (step S710—NO), the process returns to step S702.

If there are no shot regions to which the pattern has not been transferred (step S710—YES), the process proceeds to step S711.

In step S711, the X-Y stage 4 is moved to a predetermined position for recovery of the wafer 1 (step S8 in FIG. 7).

Although the operation and advantages of transferring the pattern to the wafer 1 has been described above with reference to FIG. 8, it is possible to transfer the pattern by positioning some shot regions using a die-by-die alignment method. For example, the die-by-die alignment method is used for the shot regions in the central portion of the wafer, where the alignment accuracy is high. For the shot regions near the periphery of the wafer, where alignment errors seem to be large, pattern transfer may be performed using the global alignment method.

In this case, the die-by-die alignment is performed before or after step S704 in FIG. 8. More specifically, using the TTM alignment scopes 30 and 30', the positional deviation between the alignment marks M1 and M2 on the mold 10, shown in FIG. 10, and the alignment marks W1 and W2 on the wafer 1 is measured. Then, the amount of positional deviation in the θ direction is calculated from the amount of positional deviations in the x and y directions, and the correction of the positional deviations in the x, y, and θ directions (positioning) is performed by the fine-motion stage 3.

Figure 3:
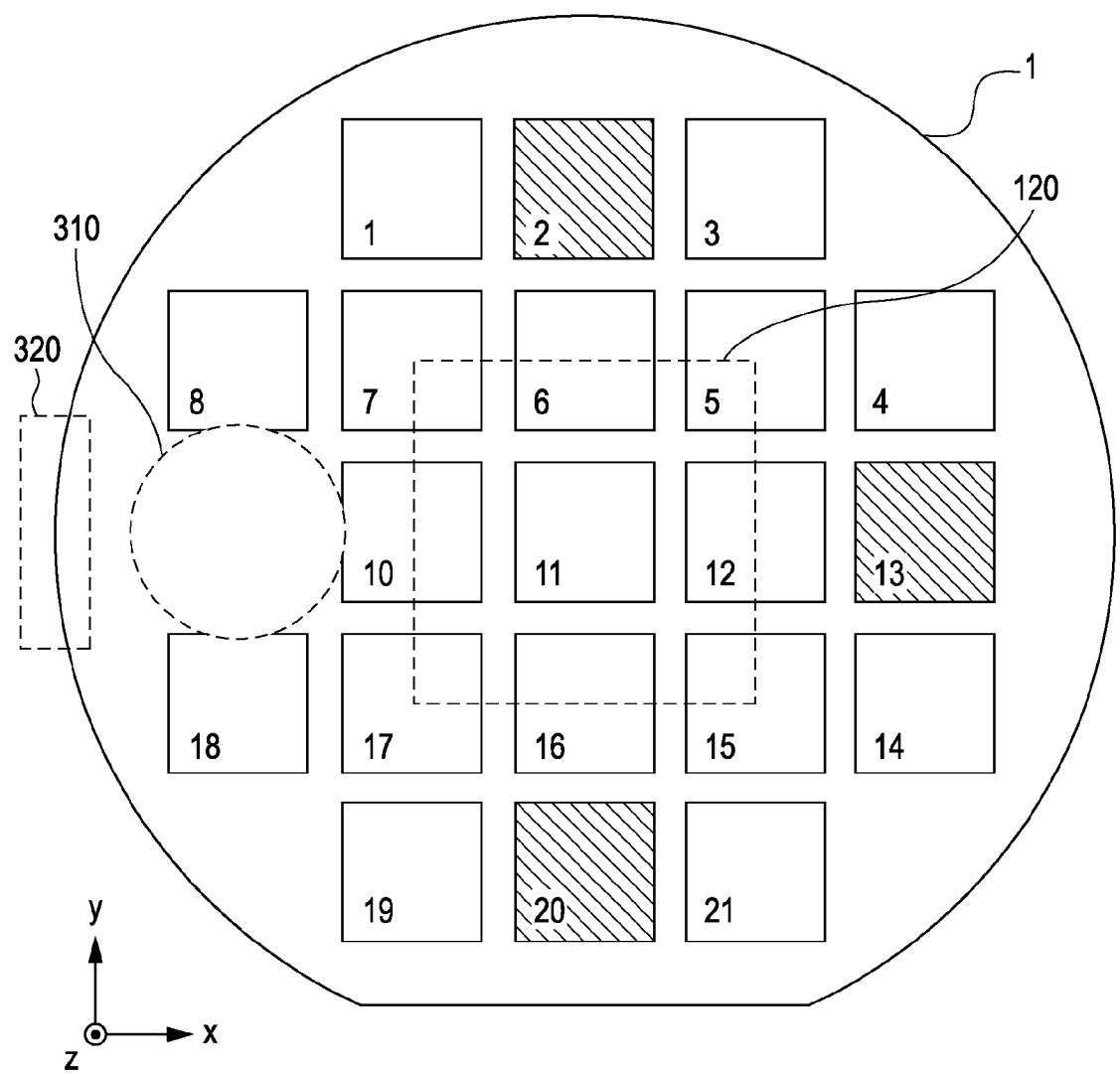
FIG. 3 is a diagram showing an arrangement of an off-axis alignment scope according to the first embodiment.

FIG. 3 is a diagram showing an arrangement of an off-axis alignment scope according to the first embodiment, showing the case where the center of the mold chuck 11 is aligned with the center of the wafer chuck 2 in the xy plane. FIG. 3 is a plan view showing the positional relationship between the wafer 1, the projections of the mold chuck stage 12, dispenser head 32, and off-axis alignment scope 31 on the xy plane.

In FIG. 3, reference numerals 120, 310, and 320 denote the projections of the mold chuck stage 12, off-axis alignment scope 31, and dispenser head 32, respectively.

The alignment measurement may be performed by moving the XY stage 4 such that the four sample shot regions 2, 9, 13, and 20 are sequentially brought to a position beneath the off-axis alignment scope 31.

In the xy plane, the center of the off-axis alignment scope 31 (second scope) is disposed between the center of the dispenser and the center of the mold chuck. However, the arrangement is not limited thereto as long as the center of the second scope is located near the center of the dispenser. This can prevent the X-Y stage from increasing the stroke length to measure the sample shot regions from the stroke length required for the dispenser to distribute the resin to all shots on the wafer, or can reduce the amount of such an increase. For example, the following arrangement may be used. That is, the center of the dispenser is disposed at a position deviated from the center of the mold chuck by a first distance (>0) in a certain direction (for example, in the X-axis minus direction). At this time, the center of the second scope is disposed at a position deviated from the center of the dispenser by a distance smaller than twice the first distance in the aforementioned direction or the direction opposite thereto. This prevents the stroke length of the X-Y stage in, for example, the X-axis direction from becoming too large. It is more desirable that this condition be met both in the X- and Y-axis directions.

The center of the dispenser means the center of the resin discharge ports provided in the dispenser opposite the substrate, and the resin discharge ports form, for example, a linear or rectangular area having multiple openings (holes). Typically, the projection of the mold chuck 11 on the xy plane is rectangular, and the center of the mold chuck 11 means the center of the rectangular shape. Typically, the projection of the substrate chuck on the xy plane is circular, and the center of the substrate chuck means the center of the circular shape. Typically, the field of view or final optical surface of the second scope is circular, and the center of the second scope means the center of the circle.

Second Embodiment

Figure 4:
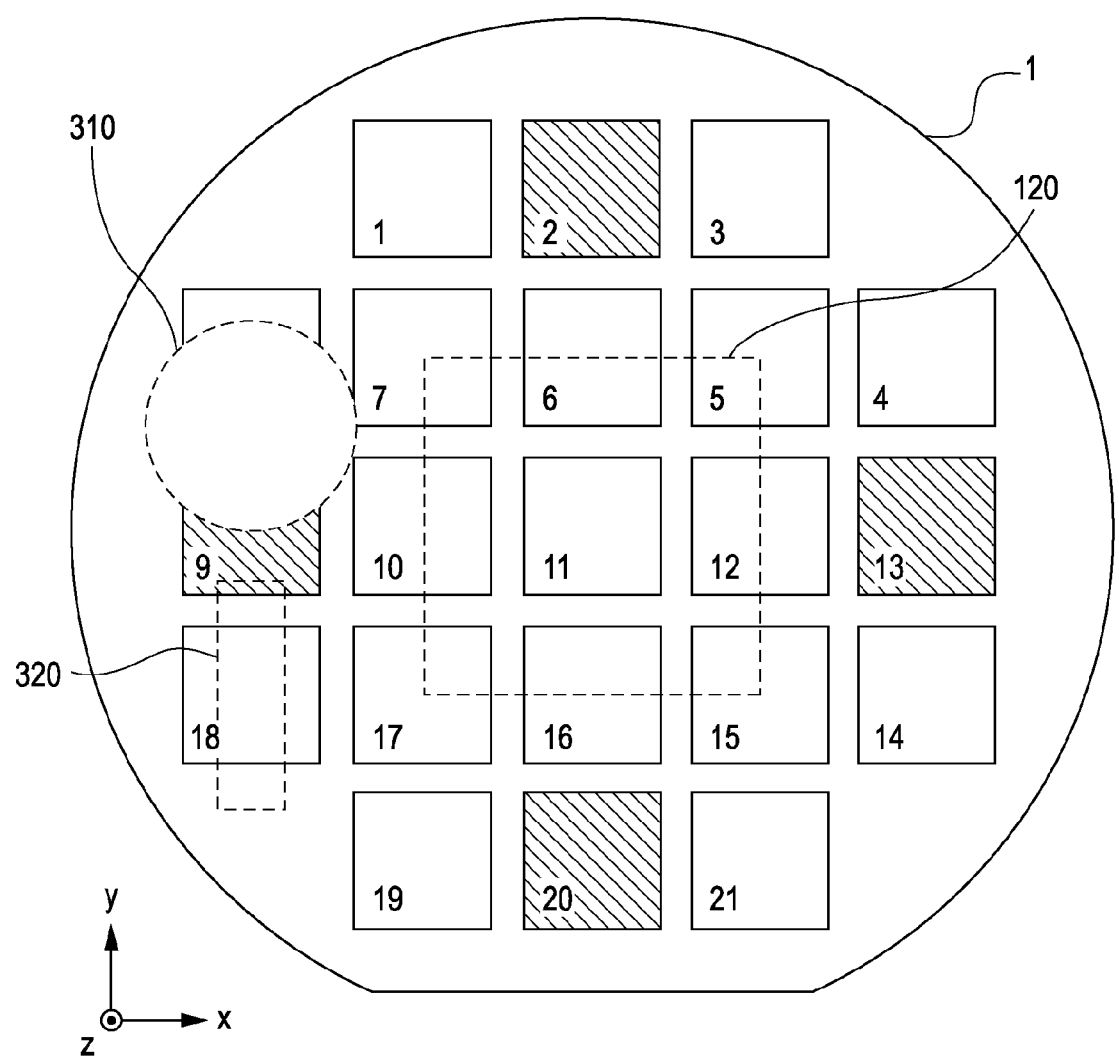
FIG. 4 is a diagram showing an arrangement of an off-axis alignment scope according to a second embodiment of the present invention.

FIG. 4 is a diagram showing an arrangement of an off-axis alignment scope according to a second embodiment of the present invention. The components having the same functions as those shown in FIG. 3 are denoted by the same reference numerals, and explanations thereof are omitted.

In FIG. 4, the dispenser head 32 and the off-axis alignment scope 31 are positioned at substantially the same coordinates in the x direction. This arrangement provides the same advantages as the first embodiment and reduces the size of the alignment scope shelf 18 in the x direction.

As long as, in the xy plane, the center of the dispenser and the center of the second scope may be disposed at positions deviated from the center of the mold chuck by the first distance (>0) in a certain direction (for example, in the X-axis minus direction), the arrangement is not limited to that shown in FIG. 4.

Third Embodiment

Figure 5:
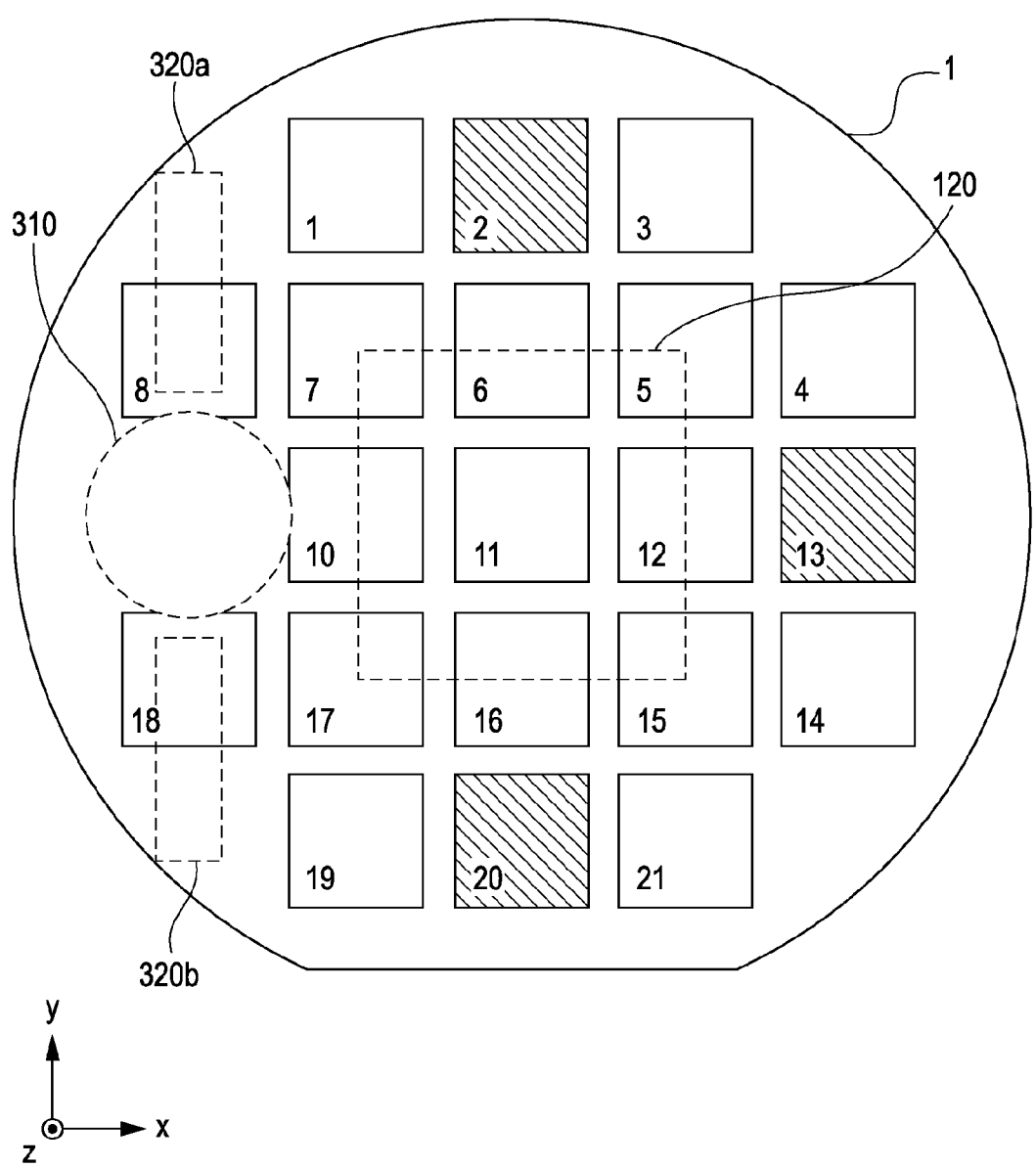
FIG. 5 is a diagram showing an arrangement of an off-axis alignment scope according to a third embodiment of the present invention.

FIG. 5 is a diagram showing an arrangement of an off-axis alignment scope according to a third embodiment of the present invention. The components having the same functions as those shown in FIG. 3 are denoted by the same reference numerals, and explanations thereof are omitted.

In FIG. 5, reference numerals 320a and 320b denote the projections of dispenser heads 32a and 32b (not shown), respectively. In FIG. 5, the off-axis alignment scope 31 and the two dispenser heads are arranged at substantially the same coordinates in the x direction.

Also in the case where there are a plurality of dispenser heads, by using the arrangement of FIG. 5, the same advantages as the first and second embodiments can be achieved.

Fourth Embodiment

Figure 6:
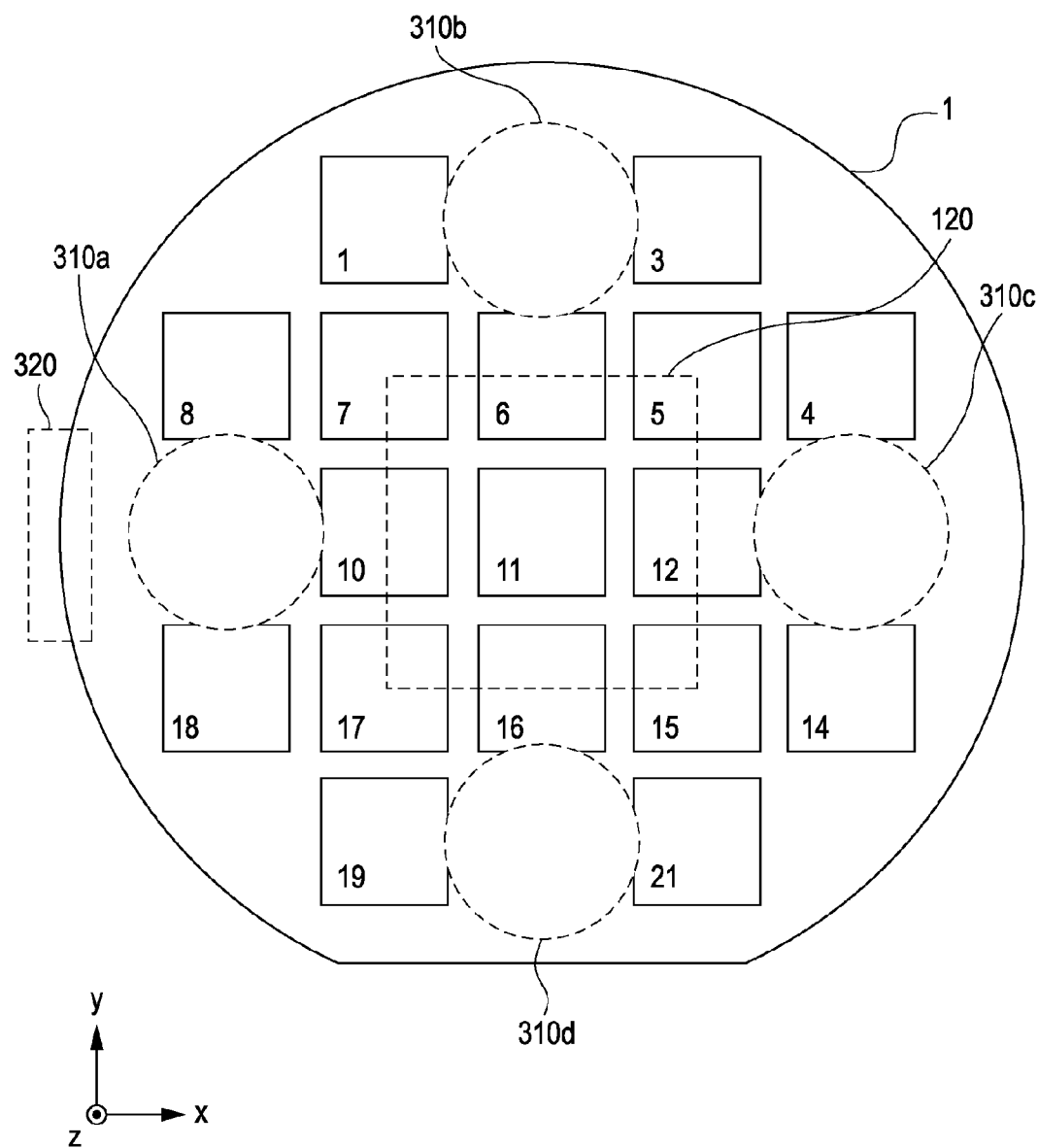
FIG. 6 is a diagram showing an arrangement of off-axis alignment scopes according to a fourth embodiment of the present invention.

FIG. 6 is a diagram showing an arrangement of off-axis alignment scopes according to a fourth embodiment of the present invention. The components having the same functions as those shown in FIG. 3 are denoted by the same reference numerals, and explanations thereof are omitted.

In FIG. 6, reference numerals 310a to 310d denote the projections of four off-axis alignment scopes 31a to 31d (not shown).

By arranging the four off-axis alignment scopes in this manner, the alignment measurement of the sample shot regions 2, 9, 13, and 20 can be simultaneously performed without moving the XY stage 4. With the four off-axis alignment scopes, the time for moving the stage for the global alignment measurement can be reduced even when the positions of the off-axis alignment scopes cannot be changed in accordance with the layout of the shot regions. In this embodiment, the number of the off-axis alignment scopes is not limited to four, but may be two or more.

That is, the following arrangement may be used. In the xy plane, the center of the dispenser is disposed at a position deviated from the center of the mold chuck by the first distance (>0) in a certain direction (for example, in the X-axis minus direction). The centers of the second scopes are disposed at positions deviated from the center of the dispenser by distances smaller than twice the first distance in the direction opposite to the aforementioned direction. This prevents the stroke length of the X-Y stage in, for example, the X-axis direction from becoming too large. It is more desirable that this condition be met both in the X- and Y-axis directions.

Typically, in the global alignment measurement, shot regions immediately inward (close to the center of the wafer) of the outermost shot regions on the wafer are used as the sample shot regions from the standpoint of the accuracy of the measurement. Therefore, in the first to third embodiments, an increase in the stroke length of the X-Y stage can be prevented or restricted to a sufficiently small value by making the distance between the off-axis alignment scope and the dispenser in the xy plane equal to or smaller than the size of one shot region (about 30 mm).

According to the above-described embodiments, it is possible to provide an imprint apparatus having a reduced stroke length of the substrate stage (X-Y stage). In addition, it is possible to provide an imprint apparatus with a small footprint and high throughput and is capable of performing global alignment.

Embodiment of Method of Manufacturing Article

A method of manufacturing devices, serving as articles, such as semiconductor integrated circuit elements, liquid crystal display elements, etc., may include a step of transferring (forming) a pattern to a substrate, such as a wafer, a glass plate, a film-like substrate, or the like, using the above-described imprint apparatus, and a step of etching the substrate. When manufacturing other articles, such as patterned media (recording media) and optical elements, a step of processing the substrate may be performed instead of the etching step.

The article manufacturing method of this embodiment has an advantage, as compared with a conventional article manufacturing method, in at least one of performance, quality, productivity and production cost of an article.

The present invention is industrially applicable in forming fine patterns for manufacturing, for example, the aforementioned articles.

While desirable embodiments of the present invention have been described above, it is to be understood that the invention is not limited to the disclosed exemplary embodiments. Any modification or variation within the scope of the invention should be possible.

This application claims priority from Japanese Patent Application No. 2008-246333, entitled "imprint apparatus and method of manufacturing article" and filed on Sep. 25, 2008, the entire contents of which are incorporated herein by reference.

What is claimed is:

1. An imprint apparatus for pressing resin on a shot region of a substrate and a mold to each other to form a resin pattern on the shot region, the apparatus comprising:
   a mold chuck;
   an X-Y stage including a substrate chuck, resin on the shot region of the substrate held by the substrate chuck and the mold held by the mold chuck being pressed to each other in a Z-axis direction;
   a reference mark formed on the X-Y stage;
   a first scope configured to measure a positional deviation in an x-y plane between a mold mark formed on the mold held by the mold chuck and the reference mark;
   a second scope configured to measure a position of a substrate mark formed on the substrate in the x-y plane not via the mold mark; and
   a dispenser configured to dispense resin on the shot region, wherein, in the x-y plane, a center of the dispenser is disposed at a position deviated from a center of the mold chuck by a first displacement having first x and y components, and a center of the second scope is disposed at a position deviated from the center of the mold chuck by a second displacement having second x and y components, wherein the value of one of the second x and y components is same as the value of corresponding one of the first x and y components.

2. A method of manufacturing an article, the method comprising:
   forming a resin pattern on a shot region of a substrate using an imprint apparatus; and
   processing the substrate, to which the resin pattern has been formed, to manufacture the article,
   wherein the imprint apparatus is an imprint apparatus for pressing resin on a shot region of a substrate and a mold to each other to form a resin pattern on the shot region, the apparatus comprising:
   a mold chuck;
   an X-Y stage including a substrate chuck, resin on the shot region of the substrate held by the substrate chuck and the mold held by the mold chuck being pressed to each other in a Z-axis direction;
   a reference mark formed on the X-Y stage;
   a first scope configured to measure a positional deviation in an x-y plane between a mold mark formed on the mold held by the mold chuck and the reference mark;
   a second scope configured to measure a position of a substrate mark formed on the substrate in the x-y plane not via the mold mark; and
   a dispenser configured to dispense resin on the shot region, wherein, in the x-y plane, a center of the dispenser is disposed at a position deviated from a center of the mold chuck by a first displacement having first x and y components, and a center of the second scope is disposed at a position deviated from the center of the mold chuck by a second displacement having second x and y components, wherein the value of one of the second x and y components is same as the value of corresponding one of the first x and y components.

3. An apparatus according to claim 1, further comprising a third scope configured to measure a position of a substrate mark formed on the substrate in the x-y plane not via the mold mark.

4. A method according to claim 2, wherein the apparatus further comprises a third scope configured to measure a position of a substrate mark formed on the substrate in the x-y plane not via the mold mark.

5. An apparatus according to claim 1, wherein the value of the other of the second x and y components is smaller than the value of the other of the first x and y components.

6. A method according to claim 2, wherein the value of the other of the second x and y components is smaller than the value of the other of the first x and y components.

* * * * *